（12） United States Patent
Byfield et al.

(10) Patent No.: US 11,764,033 B2
(45) Date of Patent: Sep. 19, 2023

(54) HIGH VOLTAGE POWER SUPPLY

(71) Applicant: AES Global Holdings, Pte. Ltd., Singapore (SG)

(72) Inventors: Gary Byfield, Fort Collins, CO (US); Arthur Flatt, Fort Collins, CO (US)

(73) Assignee: AES Global Holdings, Pte. Ltd., Singapore (SG)

( * ) Notice: Subject to any disclaimer, the term of this patent is extended or adjusted under 35 U.S.C. 154(b) by 0 days.

(21) Appl. No.: 17/623,687

(22) PCT Filed: Jul. 3, 2020

(86) PCT No.: PCT/US2020/040803
§ 371 (c)(1),
(2) Date: Dec. 29, 2021

(87) PCT Pub. No.: WO2021/003458
PCT Pub. Date: Jan. 7, 2021

(65) Prior Publication Data
US 2022/0246390 A1    Aug. 4, 2022

(30) Foreign Application Priority Data

Jul. 4, 2019  (EP) .................................... 19184399

(51) Int. Cl.
*H02M 3/156* (2006.01)
*H01J 37/24* (2006.01)
*H02M 3/155* (2006.01)

(52) U.S. Cl.
CPC ........... *H01J 37/241* (2013.01); *H02M 3/155* (2013.01)

(58) Field of Classification Search
None
See application file for complete search history.

(56) References Cited

U.S. PATENT DOCUMENTS 4,400,660 A    8/1983  Schaefer
6,320,319 B1 *  11/2001  Iwai ...................... H01J 37/241
                                                    315/106
(Continued)

FOREIGN PATENT DOCUMENTS

CN        105356438 B     3/2019
EP         1862879 A1    12/2007
(Continued)

OTHER PUBLICATIONS

European Patent Office, "Extended European Search Report Regarding Application No. 19184399.4", dated Feb. 3, 2020, p. 10, Published in: EP.

(Continued)

*Primary Examiner* — Jeffery S Zweizig
(74) *Attorney, Agent, or Firm* — Neugeboren O'Dowd PC

(57) ABSTRACT

The present invention provides for a high voltage direct current power supply including a primary high voltage direct current supply offering a primary output; a floating secondary output floating with respect to the primary output and fed by the primary output: an output terminal at the floating secondary output for providing an output voltage; a controller operative to detect a change in the output voltage at the output terminal and to generate a control signal responsive to the change in output voltage; and a controllable current source, which can comprise a programmable current source, arranged to provide current at the floating secondary output responsive to the said control signal and whereby the said current is provided to reduce charging of a secondary output capacitance as the output voltage changes.

17 Claims, 9 Drawing Sheets

(56) References Cited

U.S. PATENT DOCUMENTS

| | | | |
|---|---|---|---|
| 10,096,705 | B2 | 10/2018 | Nielsen et al. |
| 10,973,112 | B2 * | 4/2021 | Kadoi .................. H01J 37/241 |
| 2015/0116881 | A1 | 4/2015 | Burnett et al. |
| 2015/0222115 | A1 | 8/2015 | Zhu |
| 2016/0336442 | A1 | 11/2016 | Nielsen et al. |

FOREIGN PATENT DOCUMENTS

| | | |
|---|---|---|
| EP | 2750271 A1 | 7/2014 |
| EP | 3164878 A1 | 5/2017 |
| JP | 2013196324 A | 9/2013 |

OTHER PUBLICATIONS

Xiofan Tang, "International Preliminary Report on Patentibility Regarding International Application No. PCT/US2020/040803", dated Jan. 13, 2022, p. 8, Published in: CH.

Riju Jacob, "International Search Report and Written Opinion Regarding International Application No. PCT/US2020/040803", dated Sep. 2, 2020, p. 16, Published in: AU.

JPO, "Office Action Received in Japanese Patent Application No. 2021-578025", dated Feb. 6, 2023, p. 6, Published in: JP.

* cited by examiner

HIGH VOLTAGE POWER SUPPLY

The present invention relates to a high voltage direct current power supply, and to a related supply method, such as for use in electron-emission systems such as Electron Beam Inspection (EBI), Scanning Electron Microscope (SEM) and lithography applications. In particular, the invention can relate to a high voltage direct current power supply comprising a 'floating' high voltage electrical power output for the emission and manipulation the of a flow of charged particles for the aforementioned applications.

BACKGROUND

High Voltage Direct Current HVDC power supplies suitable for use in Electron Beam Inspection (EBI), Scanning Electron Microscope (SEM) and lithography applications typically share a common electrical architecture comprising a primary HVDC power output referenced to Earth potential, and feeding one or more secondary HVDC power outputs referenced to a common 'floating' ground (i.e. several tens of kV from Earth potential). A schematic view of such a supply is illustrated in FIG. 1.

The primary HVDC output power source 105 typically comprises a variable HVDC power source capable of delivering tens of kilovolts of output voltage. Commonly known as an accelerator, such a power source form the first stage in an electron supply system.

A terminal 106 of the primary output power source is connected to one or more secondary HVDC output power sources 103,104 such that they are all referenced to a common 'floating' ground. In operation, these secondary HVDC output power sources may be 'floating' at several tens of kilovolts away from Earth potential on the primary HVDC output power source 105.

Exemplary floating secondary HVDC output power sources 103,104 may include, for example, a suppressor output 104 (typically rated to −1000 V DC at 20 uA) suitable for controlling the movement of a cloud of electrons (i.e. charged particles) emitted by an electron emitter, and an extractor output 103 (typically rated to 10 kV DC at 400 uA) suitable for controlling the amount and manner in which the electrons are extracted from the electron emitter. Also present on the secondary supply side is a low voltage DC output power source, for example, a heater output 107 (typically rated to 5 V DC at 3 A) suitable for powering an electron emitter source (i.e. the electron emitter). However, the operation of the low voltage DC output power source is not being considered in this application.

As structural complexities and aspect ratios of ebeam related formations continue to develop and place ever greater pressure on system operational requirements, for example, as the complexity of modern Integrated Chip IC design continue to rise requiring structures on wafers to be increasingly more intricate and complicated (i.e. higher aspect ratios and smaller structures), primary HVDC output power sources 105 (i.e. accelerators) are being required to operate at increasingly higher slew rates (i.e. rate of change of output voltage) as the electron beam is scanned over the wafer. This enables the required aspect ratios to be achieved on the surface a wafer to create the complex device structures required to produce high performance ICs used in new emerging applications.

An inherit limitation of the electrical architecture of such HVDC power supplies is that increasing the slew rate of the accelerator output may generate voltage disturbances on the floating secondary HVDC outputs which may in turn have an undesirable effect of affecting the biasing of the ebeam column and therefore the characteristics defining the resulting device structure.

Limiting the accelerator slew rate to reduce the voltage disturbances is not a practical solution as this increases the wafer fabrication/processing time substantially. The market is driving for faster inspection time and higher emitter life (i.e. through the adoption of smaller column V changes).

FIG. 1 illustrates an electrical architecture of a typical HVDC power supply 100 for use in Electron Beam Inspection (EBI), Scanning Electron Microscope (SEM) and lithography applications. The voltage disturbance mechanism will be explained in further detail in the latter sections. In principle, if the accelerator output voltage is increased or decreased rapidly, a capacitive divider is formed between the floating extractor output capacitance (C2) 101 and cable capacitance (C8) 102, which in turn creates an undesirable voltage disturbance on the extractor output. The time the extractor output takes to settle is finite and depends on the transient response of the power source.

While it may be possible to install capacitors with suitable capacitance to smooth out the voltage disturbances to the floating extractor and suppressor outputs, such an approach is not practical as this creates an energy hazard from unintended rapid discharge of the capacitors and effects the response and settling time of the output.

The invention seeks to provide for a HVDC power supply and related supply method having advantages over known such supplies and methods. In particular, the invention seeks to provide for a HVDC power supply and related supply method which can address problems in the current art without exhibiting at least one of the limitations noted above.

Aspects and embodiments of the present invention have been devised with the foregoing in mind.

SUMMARY

Viewed from a first aspect, the present invention provides a high voltage direct current power supply comprising: a primary high voltage direct current supply offering a primary output; a floating secondary output floating with respect to the primary output and fed by the primary output, an output terminal at the floating secondary output for providing an output voltage; a controller operative to detect a change in the output voltage at the output terminal and to generate a control signal responsive to the change in output voltage; and a controllable current source arranged to provide current at the floating secondary output responsive to the said control signal and whereby the said current is provided to reduce charging of a secondary output capacitance as the output voltage changes.

Viewed from a second aspect, the present invention provides a method of providing high voltage direct current power comprising: providing at a primary output a primary high voltage direct current supply; providing a floating secondary output floating with respect to the primary output and feeding the floating secondary output by the primary output; providing an output voltage at an output terminal at the floating secondary output, detecting a change in the output voltage at the output terminal and generating a control signal responsive to the change in output voltage; and providing, by way of a controllable current source, current at the floating secondary output responsive to the said control signal and whereby the said current is provided to reduce charging of a secondary output capacitance as the output voltage changes.

Aspects and advantages of embodiments of the present invention will be more fully understood and appreciated upon consideration of the following detailed description and accompanying drawings, which set forth illustrative embodiments by way of example only.

DETAILED DESCRIPTION

Aspects and embodiments of the invention are not limited to the following description, as such may, of course, vary. It is also to be understood that the terminology used herein is for the purpose of describing particular embodiments only, and not intended to be limiting, since the scope of protection sought will be limited only by the appended claims construed or interpreted in accordance with prevailing practice and law.

Unless defined otherwise, all technical and scientific terms used herein have the same meaning as commonly understood by one of ordinary skill in the art to which aspects and embodiments of this invention belongs or as determined by the context in which they are used. Although any methods and materials similar or equivalent to those described herein can also be used in the practice or testing of the present invention, a limited number of illustrative methods and materials are described herein.

Voltage Disturbance Mechanism

In order to better illustrate the voltage disturbance mechanism affecting the normal function of the 'floating' secondary HVDC output power source (i.e. an extractor or suppressor), different modes of operation of the HVDC power supply will now be analysed.

Figure 1:
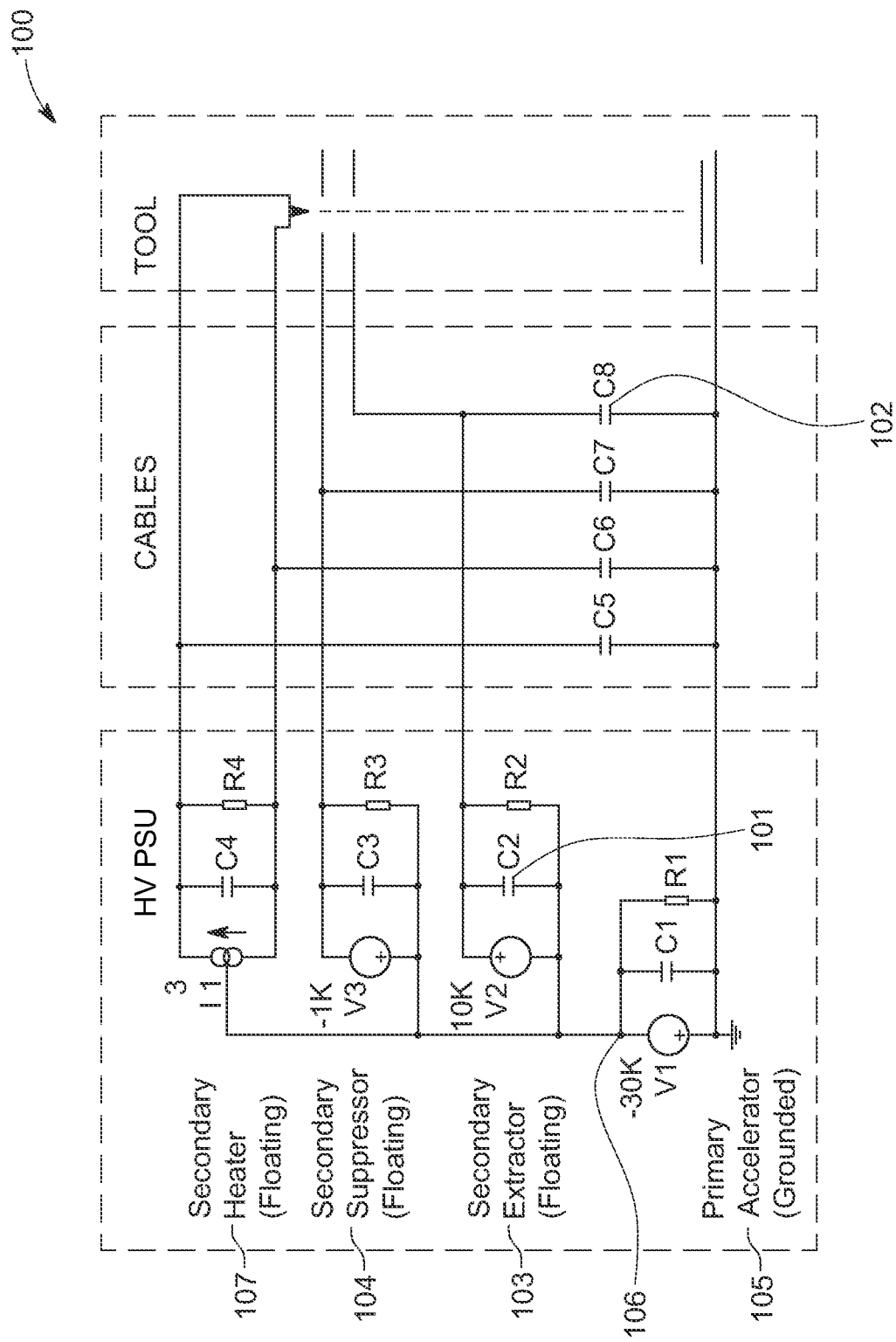
FIG. 1 is a block diagram view of a HVDC power supply, for example, for use in Electron Beam Inspection (EBI), Scanning Electron Microscope (SEM) and lithography applications.
Figure 2:
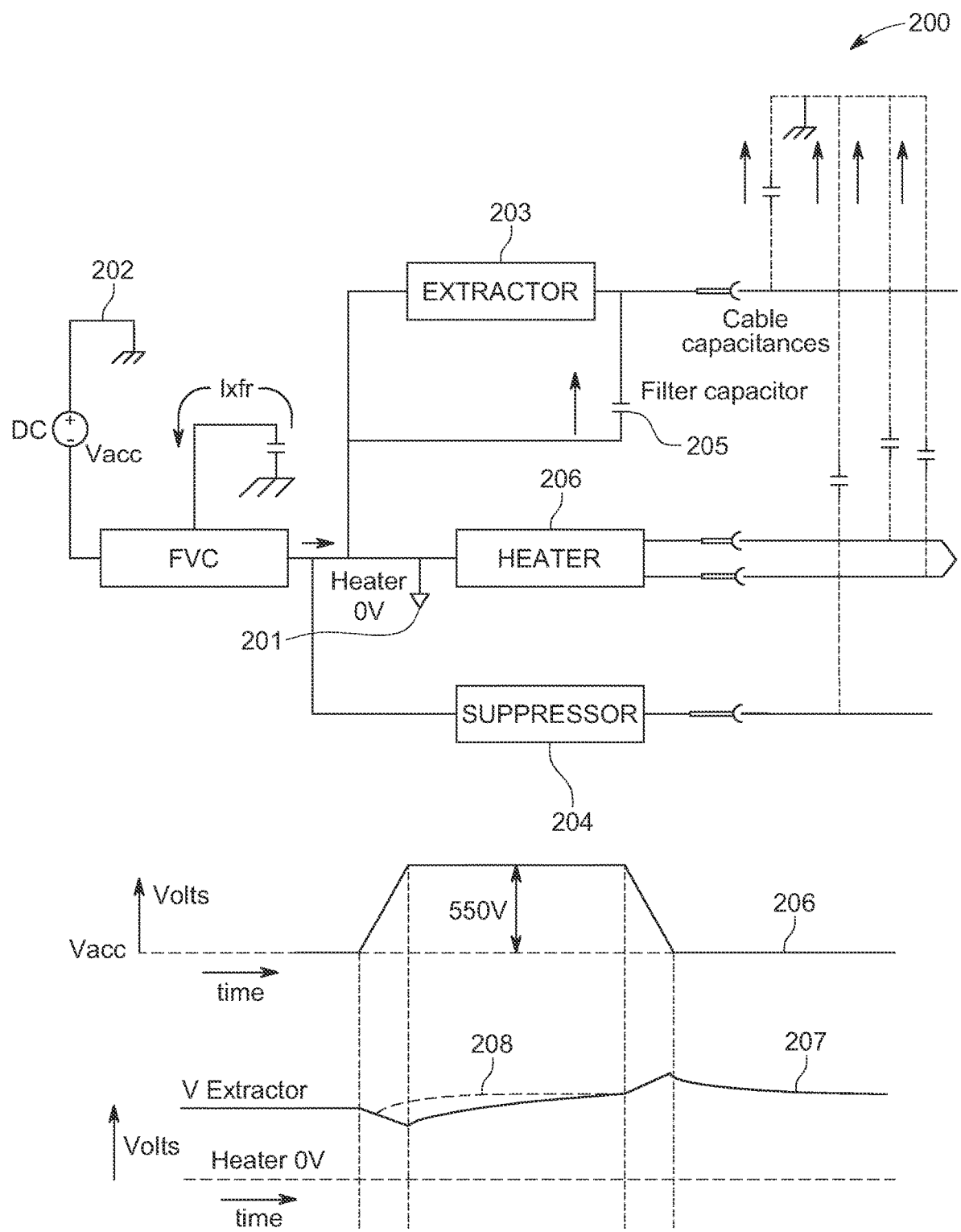
FIG. 2 is a schematic view illustration of the HVDC power supply including a plot of several voltage traces derived from the circuit.

FIG. 2 is an exemplary schematic view of a typical circuit architecture of such a HVDC power supply. The circuit shows a primary HVDC output power source (an accelerator) where the output is referenced to Earth potential 202 and two secondary 'floating' HVDC output power sources, an extractor 203 and a suppressor 204. The outputs of these secondary sources are both referenced to a 'floating' ground Heater_0V 201, which may be 'floating' at several tens of kilovolts away from Earth potential on the primary HVDC output power source. The voltage disturbance mechanism analyses to follow will focus primarily on the extractor source. It will be understood that the same voltage deviation mechanism equally affects the suppressor source. Also present on the secondary supply side is a low voltage DC output power source i.e. a heater output 206 also referenced to the 'floating' ground Heater_0V. However, the operation of the low voltage DC output power source is not being considered in this application.

The extractor 203 effectively presents a output having a capacitance Cf 205 which appears as connected in parallel with the extractor output and 'floating' ground Heater_0V is the output filter capacitor Cf of the extractor 205. The potential between the extractor output and Heater_0V is denoted by V_Extractor and the potential between the accelerator and 'Earth' ground is denoted by V_acc.

Figure 3:
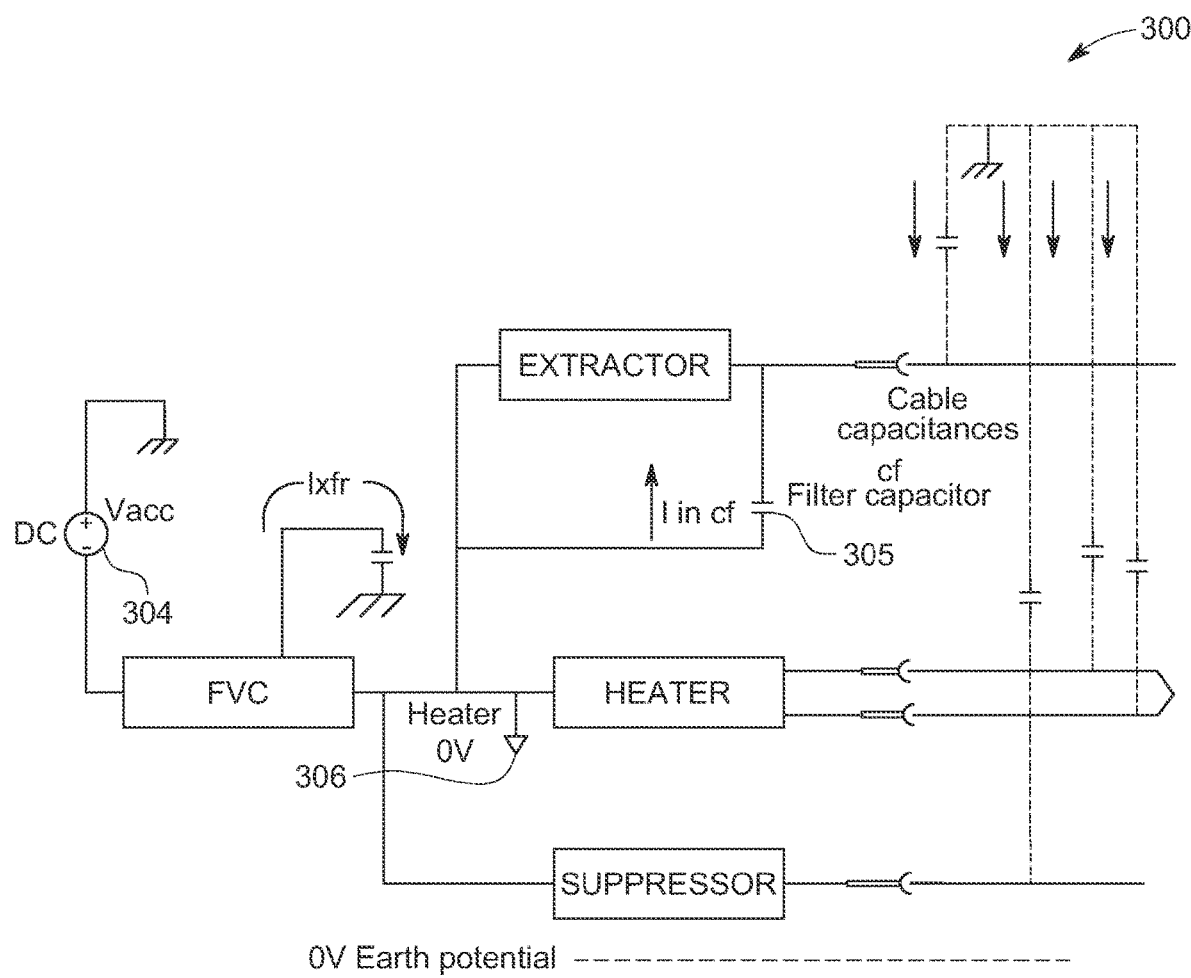
FIG. 3 is a schematic view illustration of the HVDC power supply including a plot of several voltage traces derived from the circuit during a negative excursion.
Figure 3:
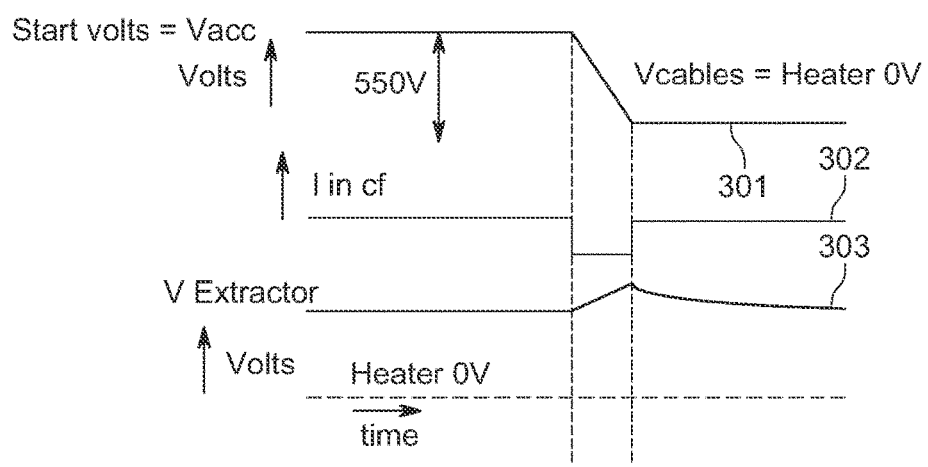

Operating Mode 1: Ramping Down the Primary HVDC Output Power Source Voltage V_Acc In a first operating mode, the output voltage V_acc, of the primary HVDC output power source (i.e. the accelerator) is ramped down at a constant rate from a pre-set magnitude. The effects of ramping down V_acc on the output voltage of the extractor V_Extractor is illustrated in FIG. 3. In this operating mode, the current in the capacitor Cf flows in a direction into Cf towards Heater_0V as shown in FIG. 3. This will be referred to hereon in as a 'negative excursion' and is representative of the voltage at the Heater_0V being forced further away from Earth potential.

Voltage trace 301 in FIG. 3 shows the voltage output waveform V_acc 304 of the accelerator. Current trace 302 in FIG. 3 shows the current waveform of the current flowing through the filter capacitor Cf. Voltage trace 303 in FIG. 3 shows the voltage output waveform V_Extractor of the extractor. The accelerator voltage output V_acc is originally set at a pre-set magnitude of, for example, 100V. During this period of operation with no V_acc voltage change, there is no current flow through the feedback capacitor Cf 305. As V_acc 304 is ramped down at a constant rate, a constant current flows into Cf 305 towards Heater_0V 306 ('floating' ground), as illustrated in the trace 302 in FIG. 3. During the time period that V_acc is ramping down, the voltage output waveform of the extractor V_Extractor is distorted in that it increases at a constant rate as a direct result of the voltage deviation mechanism in operation i.e. the capacitive divider effect described in the background section.

Once the ramping down of V_acc ceases, the consequent constant current flowing through Cf 305 ceases as shown in trace 302 in FIG. 3. V_Extractor starts to recover to its original value at a rate which depends on the transient response of the extractor, capacitance values and circuit time constants as shown in 303 in FIG. 3.

Figure 4:
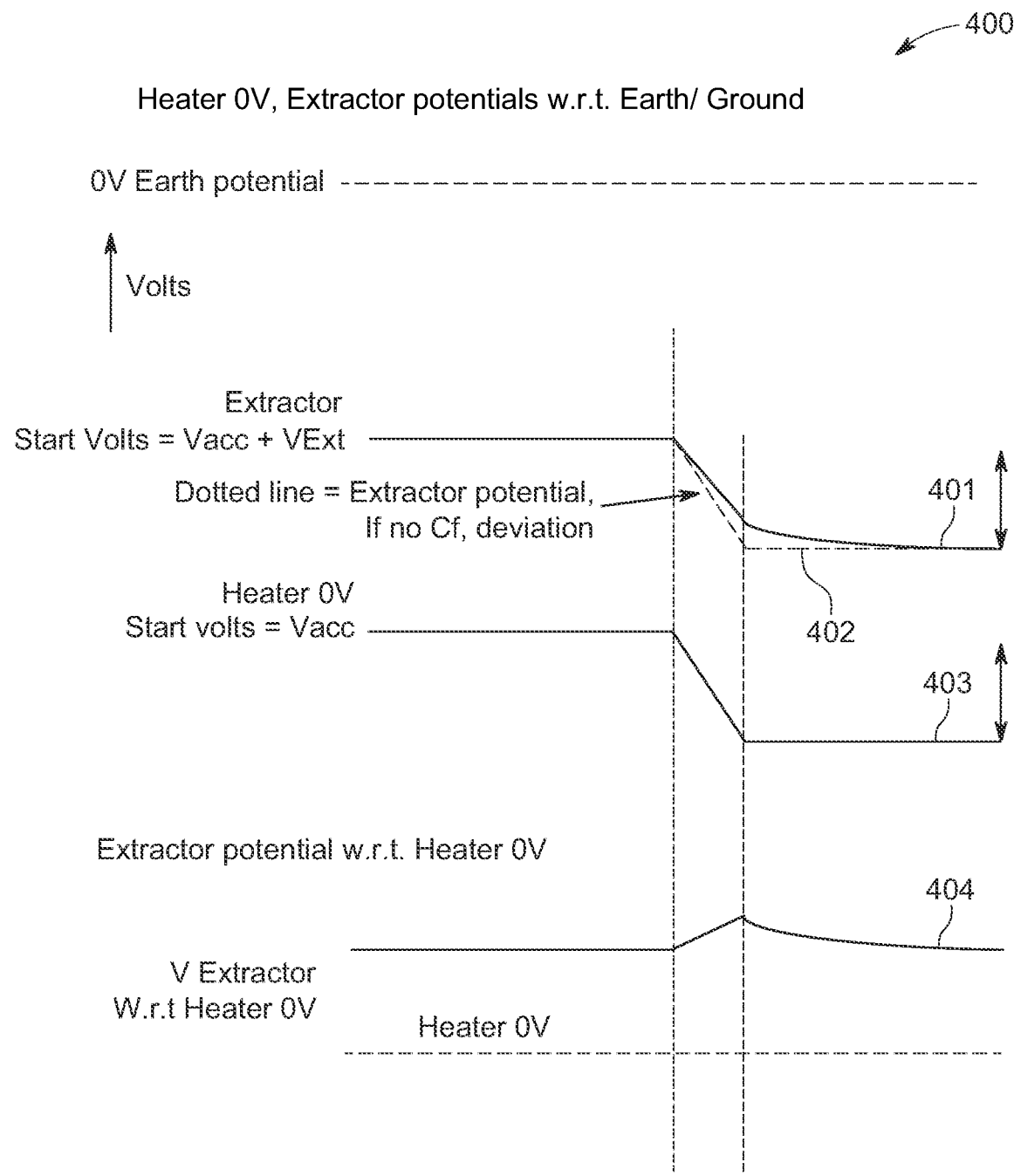
FIG. 4 is a plot of the extractor output voltage trace, the 'floating' ground Heater_0V trace and the differential potential between the two during a negative excursion.

The voltage disturbance on the extractor output during negative excursion can be more clearly observed in FIG. 4. FIG. 4 illustrates a trace of the voltage measured at V_Extractor 401,402 and Heater_0V. The voltage differential between V_Extractor and Heater_0V is shown at 404 during the negative excursion. Trace 401 shows the extractor voltage with respect to 'Earth' ground, i.e. V_acc+V_Extractor. Trace 402, superimposed over 401, is a dotted trace showing the extractor voltage with respect to 'Earth' assuming that Cf is not present or has no effect across the extractor output. The effect of the voltage disturbance to the extractor voltage with respect to 'Earth' ground due to the capacitive divider effect (Cf) is clear from the overlapping traces of 401 and 402, and a comparison of 401 and 402 confirms the source of the problematic trace 404, primarily due to the lag at the extractor output.

Taking into consideration the circuit constants, cable capacitance, and typical values of voltage slew rate, the resulting voltage disturbance can be in the region of several tens of volts. A voltage disturbance of this magnitude may be detrimental to the normal operation of the system powered by the HVDC power supply. For example, biasing of an ebeam column could be affected causing delays in operation or under/over emission.

Figure 5:
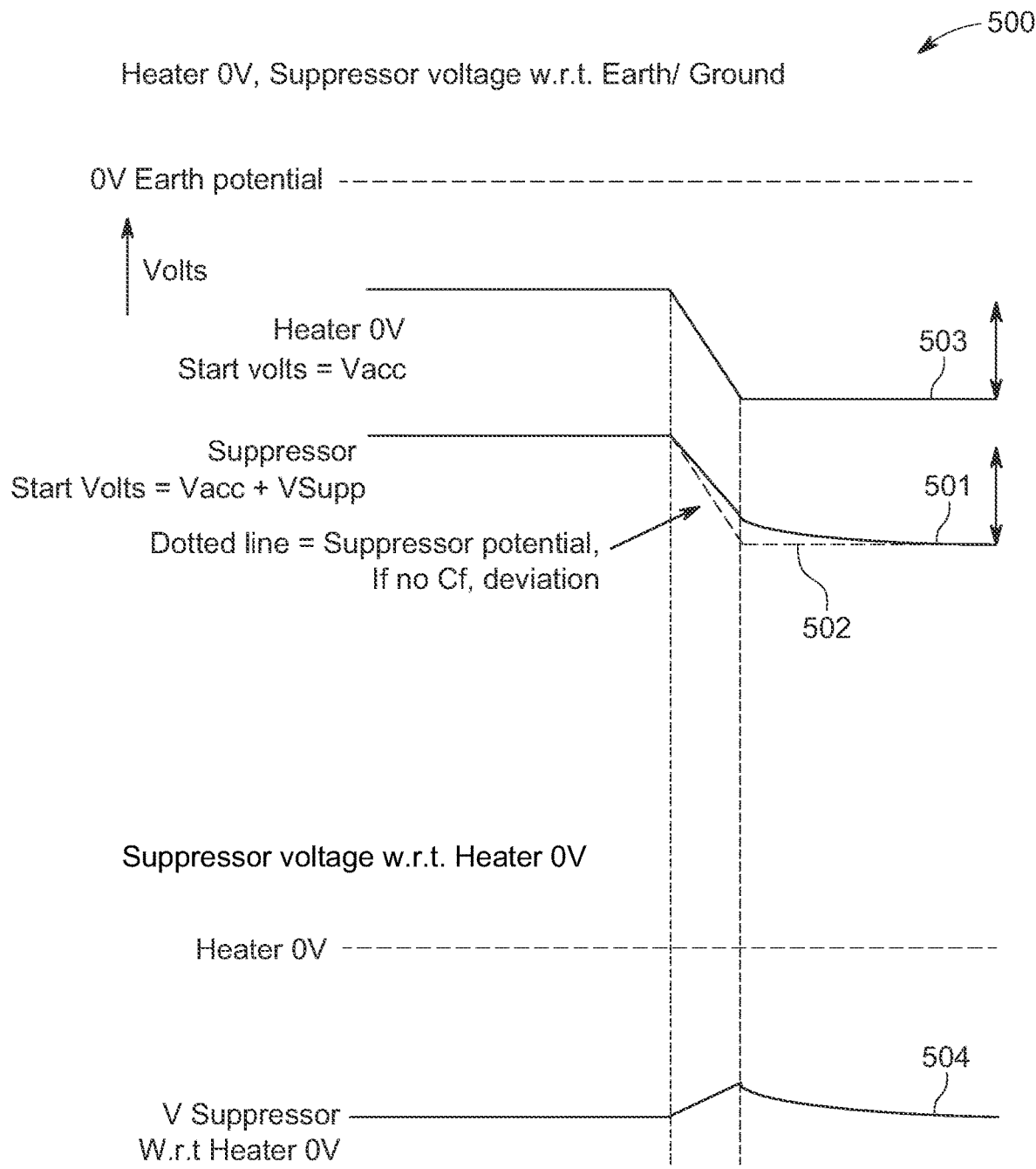
FIG. 5 is a plot of the suppressor output voltage trace, the 'floating' ground Heater_0V trace and the differential potential between the two during a negative excursion

The voltage disturbance on the suppressor output during negative current excursion is also provided in FIG. 5 for completeness. FIG. 5 illustrates the voltage measured at V_Suppressor 501,502 and at Heater_0V 503 and the voltage differential between V_Suppressor and Heater_0V 504 during the negative current excursion. 501 shows the extractor voltage with respect to 'Earth' ground, i.e. V_acc+ V_Suppressor. 502, superimposed over 501, is a dotted trace showing the extractor voltage with respect to 'Earth' assuming that Cf is not present across the extractor output. The effect of the voltage disturbance to the extractor voltage with respect to 'Earth' ground due to the capacitive divider effect (Cf) is clear from the overlapping traces of 501 and 502.

Ramping Up the Primary HVDC Output Power Source Voltage V_Acc

Figure 6:
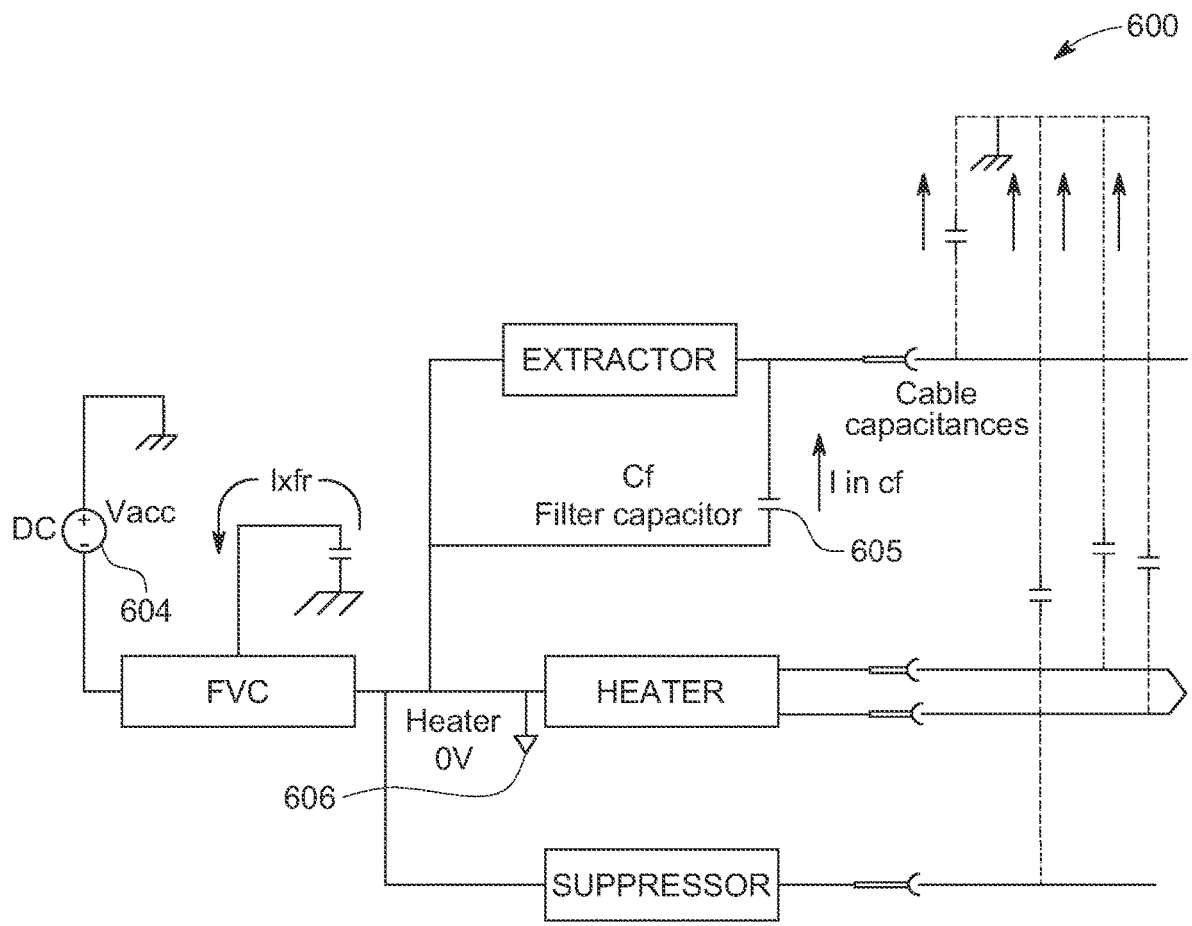
FIG. 6 is a schematic view illustration of the HVDC power supply including a plot of several voltage traces derived from the circuit during a positive excursion FIG. 7(*a*) is a schematic view illustration of the HVDC power supply connected to a programmable current source PCS including a plot of several voltage traces derived from the circuit during a positive and negative excursion.
Figure 6:
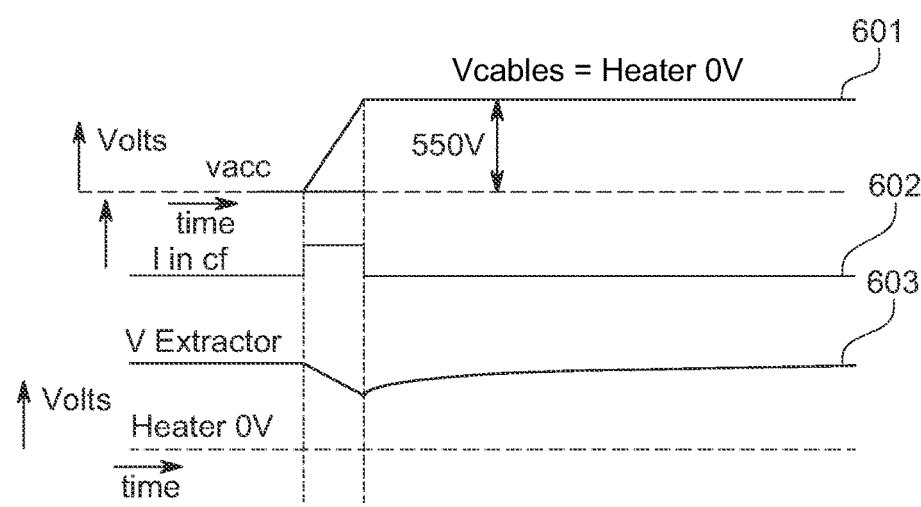

In a second operating mode, the output voltage V_acc, of the primary HVDC output power source (i.e. the accelerator) is ramped up at a constant rate from 'Earth' potential to an arbitrary value, for example, 100V. The effects of ramping up V_acc on the output voltage of the extractor V_Extractor is illustrated in FIG. 6. In this operating mode, the current in the capacitor Cf flows in a direction away from CF and the extractor as shown in FIG. 6. This will be referred to hereon in as a 'positive current excursion'.

Voltage trace 601 in FIG. 6 shows the voltage output waveform V_acc 604 of the accelerator. Current trace 602 in FIG. 6 shows the current waveform of the current flowing through the filter capacitor Cf 605. Voltage trace 603 in FIG. 6 shows the voltage output waveform V_Extractor of the extractor. The accelerator voltage output V_acc 604 is originally at 'Earth' potential. During this period of operation, no current flow through the feedback capacitor Cf. As V_acc is ramped up at a constant rate, a constant current starts to flow away from Cf 605 and the extractor as illustrated in the trace 602 in FIG. 6. During the time period that V_acc 604 is ramping up, the voltage output waveform of the extractor V_Extractor is again distorted in that it decreases at a constant rate as a direct result of the voltage deviation mechanism in operation i.e. the capacitive divider effect described in the background section.

Once the ramping up of V_acc ceases, the consequent constant current flowing through Cf 605 ceases as shown in trace 602 in FIG. 6. V_Extractor starts to recover to its original value at a rate which depends on the transient response of the extractor, capacitance values and circuit time constants as shown in 603 in FIG. 6.

The voltage disturbance mechanism on the 'floating' secondary low voltage DC output power source is negligible as the output capacitance Cf of the heater is very large and the output impedance is low compared to the other outputs Programmable Current Source PCS The disclosure herein is directed towards the provision of a system that is suitable for mitigating the voltage disturbances arising in HVDC systems used for electron emission and in particular for a HVDC power supply for use, for example, in Electron Beam Inspection (EBI), Scanning Electron Microscope (SEM) and lithography applications.

The PCS is configured to operate in such a manner that it prevents the extractor output capacitance from being charged up by effectively offering a current sink, thereby controlling at all times the magnitude of V_Extractor, during the periods when the HVDC power supply is undergoing both the positive and negative excursions.

Figure 7A:
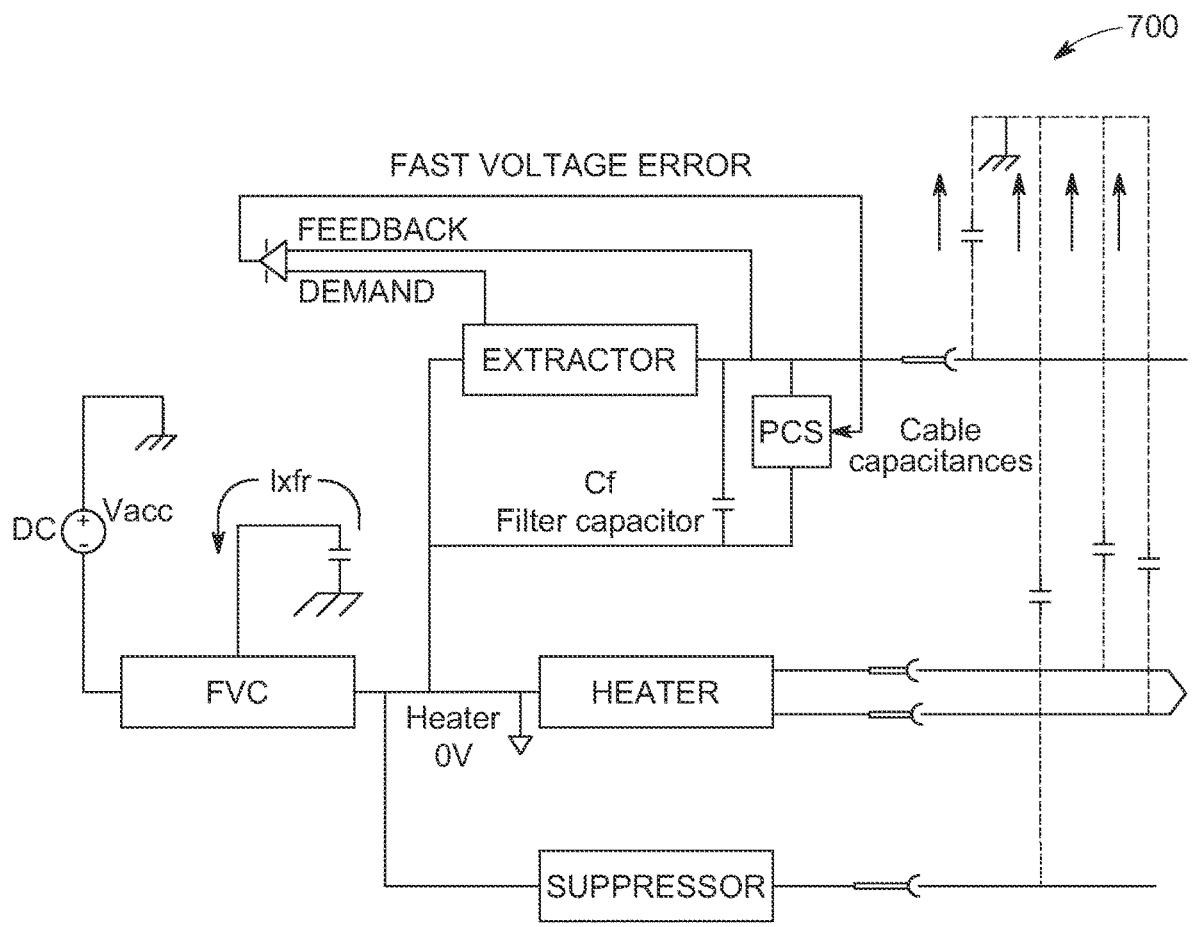
FIG. 7(*b*) is a block diagram view of the PCS.
Figure 7A:
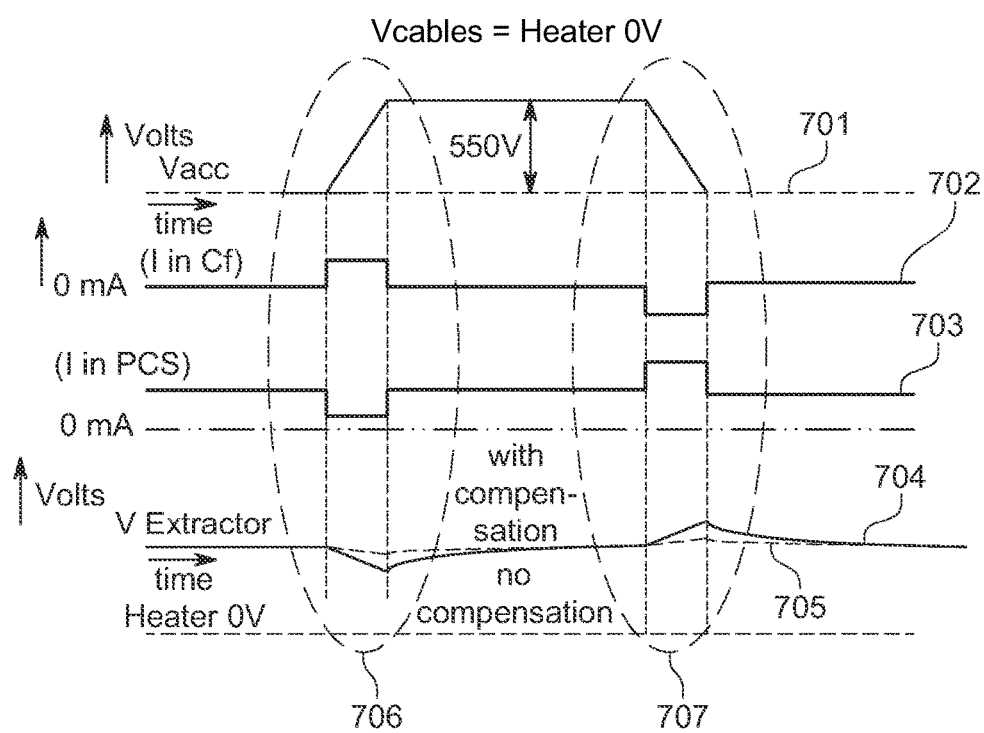
Figure 7B:
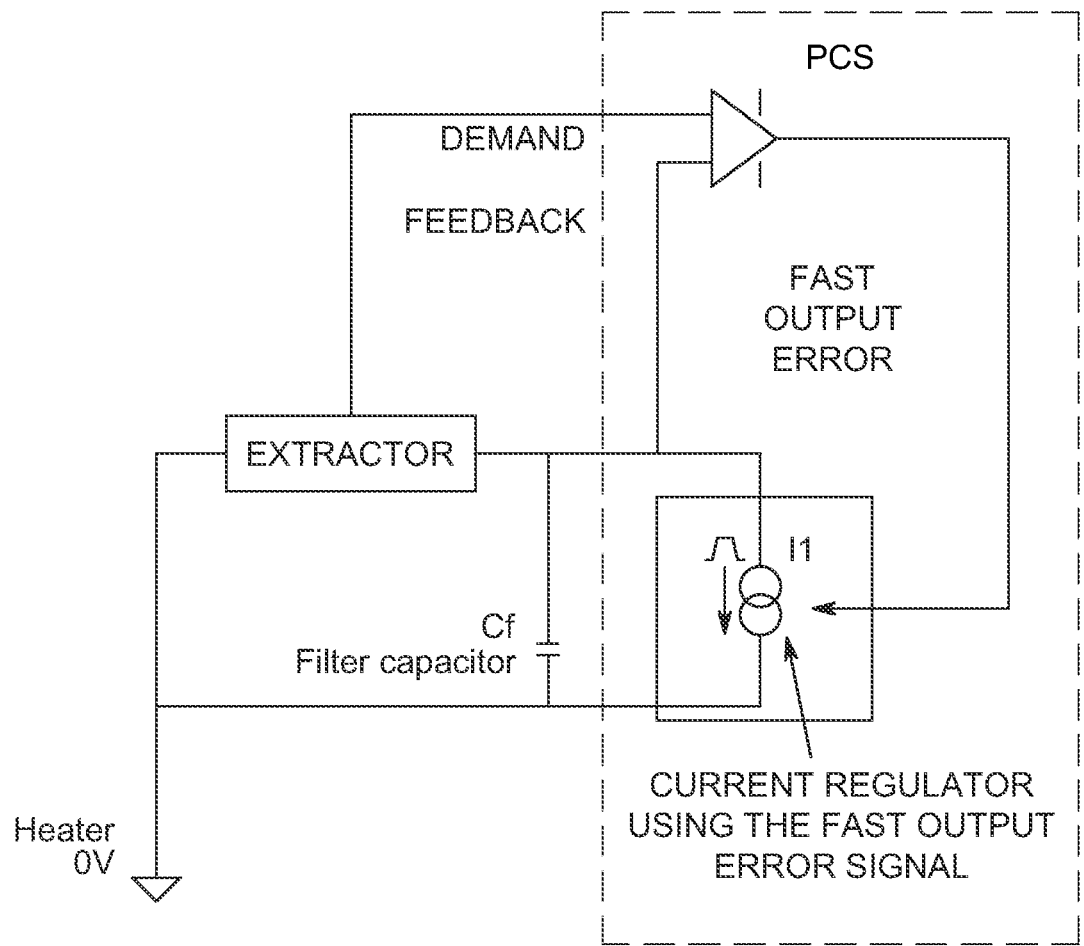

In one arrangement, a programmable current source PCS 701 is connected in parallel with the output of one of the 'floating' secondary HVDC output power sources, for example, between the positive output terminal and the 'floating' ground of the extractor, as illustrated in FIGS. 7(a) and 7(b). In another arrangement, a PCS is connected in parallel with the output of another one of the 'floating' secondary HVDC output power sources, for example, between the positive output terminal and the 'floating' ground of the suppressor. In yet another arrangement, a PCS is connected in parallel with the output of more than one of the 'floating' secondary HVDC output power sources, for example, between the positive output terminal and the 'floating' ground of the suppressor and the extractor.

Figure 8:
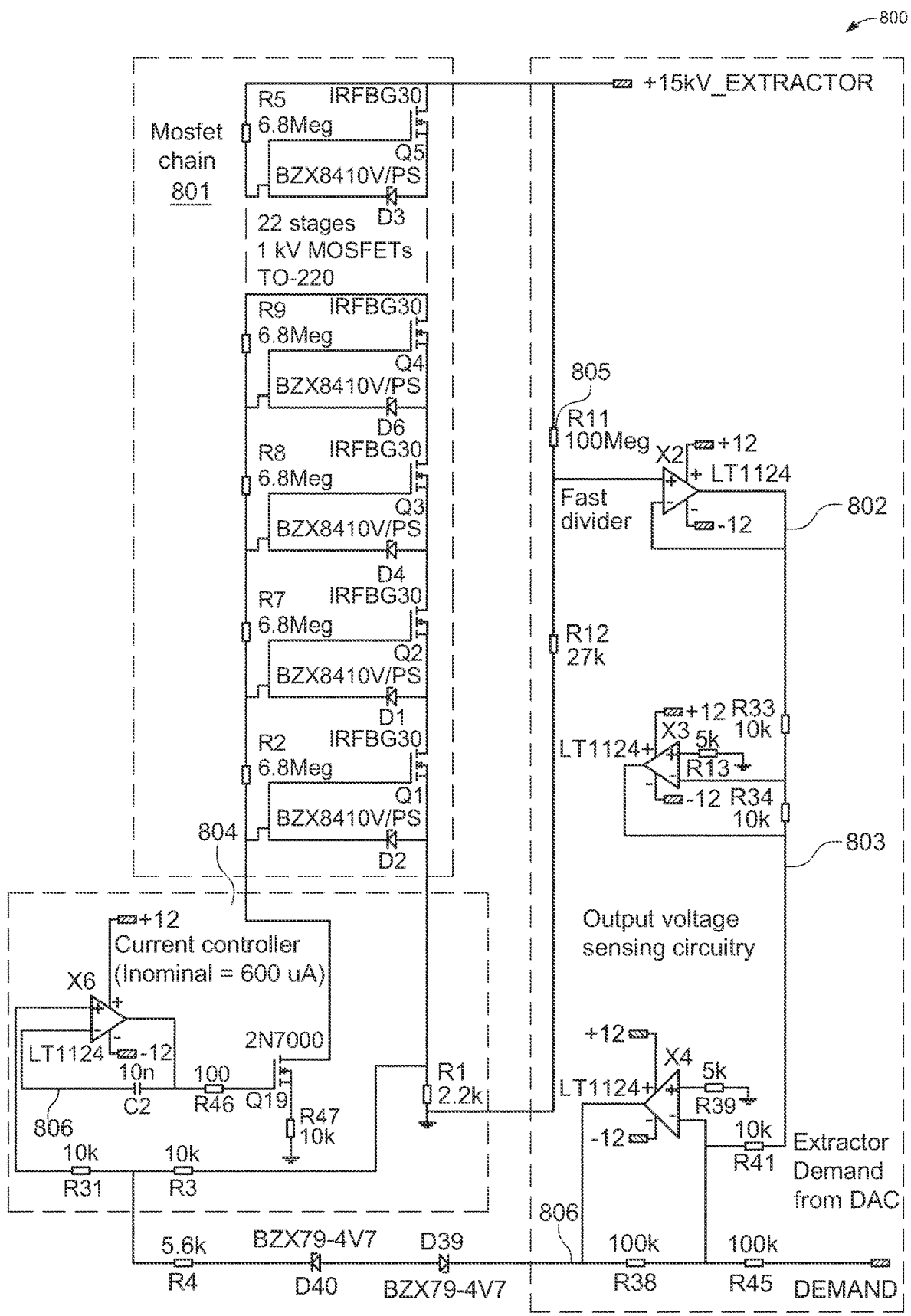
FIG. 8 is a schematic view of the circuit layout of the PCS.

In one arrangement, the PCS may comprise a chain of MOSFET devices 801 connected in a manner as shown in FIG. 8, configured to operate as part of a constant current sink that may be regulated using a current controller 804. The chain of MOSFET devices 801 within the PCS may be regulated by any other suitable controlling means, for example, using a voltage controller to achieve the desired current sink effect. The PCS may also comprise a chain of any other suitable power electronic devices, for example, BJTs, IGBTs or JFETs for the purpose of sinking current. The PCS may also comprise an output voltage deviation sensing circuitry 802,803,805 that is configured to monitor the difference between the demanded and measured output voltage of the one or more 'floating' secondary HVDC output power sources. The output voltage deviation sensing circuitry generates, for each 'floating' secondary HVDC output power source, a control signal for use by the current controller based on the detected voltage output deviation or error for the respective power sources. The current controller may increase or decrease the magnitude of the constant current sink by varying the transconductance of the MOSFET devices in the chain, based on the received control signal, that is, the amount of deviation detected between the demanded and measured output voltage. The system may also comprise any other suitable programmable current sources configured such that they may be connected in parallel with the output of one/or more of the 'floating' secondary HVDC output power sources (that is, between the positive output terminal and the 'floating' ground of the suppressor and/or extractor) to achieve the same technical effect of suppressing the aforementioned voltage disturbances.

Output Voltage Sensing Circuitry

In one arrangement, the output voltage sensing circuitry may comprise a combination of circuits such as a resistive potential divider circuit 805, a buffer circuit 802 and an inverter circuit 803, configured in a manner as shown in FIG. 8. The output voltage sensing circuitry compares the deviation between two input voltages, i.e. the difference between the demanded and measured output voltage of the 'floating' secondary HVDC output power source, to generate in real time the control signal 806 for use by the current controller 804 to regulate the constant current sink in real time.

The system may comprise any other suitable means for sensing the differential between the demanded and measured output voltages of the 'floating' secondary HVDC output power sources, for example, using a current sensor to measure the current and predicting the expected voltage difference or use a fixed correction value based on changes in demand voltages.

The system may also comprise any other suitable means for generating the control signal based on the sensed differential, for example, using YYY.

Current Controller

In one arrangement, the current controller 804 may comprise a sense resistor and amplifier configured in a manner as shown in FIG. 8. The current controller varies the transconductance of one or more MOSFETs in the MOSFET chain 801 based on the input control signal 806 supplied by the output voltage sensing circuitry 802,803,805. As the MOSFETs are adjusted, the PCS diverts excess 'parasitic' current generated from the capacitive divider effect, as explained in the preceding section, due to the capacitive divider effect from the output capacitance of the 'floating' secondary HVDC output power source (e.g. the extractor output capacitance) and the cable capacitance. In doing so, unwanted deviations to the output voltage of the 'floating' secondary HVDC output power source when the primary HVDC output power source is ramped up or down can be minimised.

Effects of the Proposed System on the Extractor Output Voltage During a Positive and Negative Current Excursion To better illustrate the effect of the proposed system on the output voltage of the extractor, FIG. 7 (*a*) shows the voltage waveform of V_Extractor 704,705 during both a positive current excursion (i.e. ramping up of V_acc) and a negative current excursion (i.e. ramping down of V_acc), the two operating modes described in the preceding paragraphs.

Voltage trace 704 in FIG. 7(*a*) shows the voltage output waveform V_Extractor (no compensation) of the extractor with no PCS compensation. Voltage trace 705 in FIG. 7(*a*) in dotted line, which is superimposed over 704, shows the voltage output waveform V_Extractor (with PCS compensation).

During the positive current excursion, i.e. the region 706, as V_acc is ramped up, the PCS detects deviation between the demanded and measured output voltage of the extractor and reacts by adjusting the magnitude the constant current sink to divert the current away from charging the extractor filter capacitance Cf, thereby controlling V_Extractor. The effect of the PCS is shown by the V_Extractor (with PCS compensation) 705. The voltage deviation caused by Cf is no longer present and V_Extractor remains substantially constant during the positive current excursion when V_acc is ramped down.

A similar effect is achieved during the negative current excursion as shown in the region 707. Again, V_Extractor remains substantially constant during the time period where V_acc is ramped down at a constant rate.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A high voltage direct current power supply comprising:
a primary high voltage direct current supply referenced to a first ground and offering a primary output;
a secondary high voltage direct current supply referenced to a floating second ground that is floating with respect to the first ground secondary output floating with respect to the primary output and fed by the primary output;
an output terminal of the secondary high voltage direct current supply at the floating secondary output for providing an output voltage;
a controller operative to detect a change in the output voltage at the output terminal and to generate a control signal responsive to the change in output voltage; and
a controllable current source arranged to provide current at the floating secondary output terminal responsive to the said control signal and whereby the said current is provided to reduce charging of a secondary output capacitance as the output voltage changes.

2. The power supply as claimed in claim 1, wherein the controllable current source is arranged in parallel with the floating secondary output connected between the output terminal and the second ground.

3. The power supply as claimed in claim 1 or 2, wherein the controllable current source comprises a programmable current source.

4. The power supply as in claim 1 wherein the controllable current source is arranged to offer a current sink.

5. The power supply as claimed in claim 4, wherein the current sink is formed by a power electronic device chain.

6. The power supply of claim 1 and arranged to be regulated by way of a sense resistor.

7. The power supply of claim 1, wherein the controller includes a resistor divider for detecting changes in the output voltage at the output terminal.

8. The power supply of claim 1 wherein the controller is arranged to produce an error signal for regulating the current source.

9. The power supply as claimed in claim 8 wherein the controller is arranged to regulate a transistor chain of the current source.

10. The power supply of claim 1, wherein the primary high voltage direct current supply comprises an accelerator power supply.

11. The high voltage current power supply of claim 1, wherein the floating output terminal of the secondary high voltage direct current power supply comprises a suppressor output.

12. The high voltage current power supply of claim 11, wherein the suppressor secondary high voltage direct current supply has a rated output voltage within a range of −100V to −3 kV.

13. The high voltage current power supply of claim 11, wherein the suppressor secondary high voltage direct current supply has a rated output power within a range of 0.1 W to 50 W.

14. The high voltage current power supply of claim 1, wherein the floating power output terminal of the secondary high voltage direct current supply includes or comprises an extractor output.

15. The high voltage current power supply of claim 14, wherein the extractor secondary high voltage direct current supply has a rated output voltage within a range of 1 kV to 15 kV.

16. The high voltage current power supply of claim 14, wherein the extractor secondary high voltage direct current supply has a rated output power within a range of 0.1 W to 20 W.

17. A method of providing high voltage direct current power comprising:
   providing, at a primary an output of a primary high voltage direct current supply referenced to a first ground, a first output voltage; primary high voltage direct current supply;
   providing, at a secondary high voltage direct current supply referenced to a second ground that is floating with respect to the first ground and fed by the output of the primary high voltage direct current supply, an output voltage at an output terminal of the secondary high voltage direct current supply; floating secondary output floating with respect to the primary output and feeding the floating secondary output by the primary output:
   providing an output voltage at an output terminal at the floating secondary output;
   detecting a change in the output voltage at the output terminal and generating a control signal responsive to the change in output voltage; and
   providing, by way of a controllable current source, current at the floating secondary output the output terminal of the secondary high voltage direct current supply responsive to the said control signal and whereby the said current is provided to reduce charging of a secondary output capacitance as the output voltage changes.

* * * * *